United States Patent
Yu et al.

(10) Patent No.: US 9,215,676 B2
(45) Date of Patent: Dec. 15, 2015

(54) BASE STATION CLOCK APPARATUS, BASE STATION SYSTEM AND METHOD FOR CLOCK SYNCHRONIZATION

(71) Applicant: HUAWEI TECHNOLOGIES CO., LTD., Shenzhen (CN)

(72) Inventors: Weidong Yu, Shanghai (CN); Yuhong Chu, Shanghai (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 236 days.

(21) Appl. No.: 13/946,184

(22) Filed: Jul. 19, 2013

(65) Prior Publication Data
US 2013/0308532 A1    Nov. 21, 2013

Related U.S. Application Data

(63) Continuation of application No. PCT/CN2011/084394, filed on Dec. 21, 2011.

(30) Foreign Application Priority Data

Jan. 21, 2011    (CN) .......................... 2011 1 0023915

(51) Int. Cl.
*H04W 56/00*    (2009.01)
*H04W 88/08*    (2009.01)
(Continued)

(52) U.S. Cl.
CPC ............. *H04W 56/00* (2013.01); *H03L 7/23* (2013.01); *H04L 7/0337* (2013.01); *H04W 88/08* (2013.01); *H04W 56/0015* (2013.01); *H04W 56/0035* (2013.01)

(58) Field of Classification Search
CPC ...................................................... H04L 7/0337

USPC .................................................... 375/376, 328
See application file for complete search history.

(56) References Cited

U.S. PATENT DOCUMENTS

| 7,970,090 B1* | 6/2011 | Tetzlaff ......................... 375/359 |
| 2003/0128720 A1 | 7/2003 | Jones |

(Continued)

FOREIGN PATENT DOCUMENTS

| CN | 1910947 | 2/2007 |
| CN | 101047428 A | 10/2007 |

(Continued)

OTHER PUBLICATIONS

International Search Report, dated Mar. 29, 2012, in corresponding International Application No. PCT/CN2011/084394 (6 pp.).

(Continued)

*Primary Examiner* — Michael Neff
(74) *Attorney, Agent, or Firm* — Staas & Halsey LLP

(57) ABSTRACT

A base station clock apparatus, a base station system, and a method for clock synchronization are provided in embodiments of the present invention. The base station clock apparatus includes: a first-standard clock module based on a first standard, configured to generate a first frequency synchronization clock signal, a first phase synchronization signal, and a first system clock signal according to a first external clock signal, where the first system clock signal includes the first frequency synchronization clock signal and the first phase synchronization signal; a second-standard clock module based on a second standard that is different from the first standard, configured to receive the first frequency synchronization clock signal and the first phase synchronization signal from the first-standard clock module, and generate a second system clock signal, where the second system clock signal includes the first frequency synchronization clock signal and the first phase synchronization signal.

13 Claims, 4 Drawing Sheets

(51) Int. Cl.
*H04L 7/033* (2006.01)
*H03L 7/23* (2006.01)

(56) References Cited

U.S. PATENT DOCUMENTS

| | | | |
|---|---|---|---|
| 2004/0104753 A1* | 6/2004 | Haraguchi et al. | 327/291 |
| 2007/0165594 A1 | 7/2007 | Heinle et al. | |
| 2009/0041171 A1* | 2/2009 | Narahari et al. | 375/359 |
| 2009/0221319 A1 | 9/2009 | Lan et al. | |
| 2009/0245228 A1* | 10/2009 | Osterling | 370/350 |

FOREIGN PATENT DOCUMENTS

| | | |
|---|---|---|
| CN | 101188817 A | 5/2008 |
| CN | 101527959 A | 9/2009 |
| CN | 101742540 A | 6/2010 |
| EP | 2251996 A1 | 11/2010 |
| WO | 01/19106 A1 | 3/2001 |
| WO | 2010/000338 A1 | 1/2010 |

OTHER PUBLICATIONS

PCT International Search Report and Written Opinion of the International Searching Authority mailed Mar. 29, 2012 in Corresponding International Application No. PCT/CN2011/084394.
Extended European Search Report mailed Oct. 18, 2013 in corresponding European Application No. 11855983.0.
Chinese Office Action issued Dec. 11, 2013 in corresponding Chinese Patent Application No. 201110023915.0.
Chinese Search Report dated Nov. 30, 2013 in corresponding Chinese Patent Application No. 201110023915O.

* cited by examiner

BASE STATION CLOCK APPARATUS, BASE STATION SYSTEM AND METHOD FOR CLOCK SYNCHRONIZATION

CROSS-REFERENCE TO RELATED APPLICATIONS

This application is a continuation of International Application No. PCT/CN2011/084394, filed on Dec. 21, 2011, which claims priority to Chinese Patent Application No. 201110023915.0, filed on Jan. 21, 2011, both of which are hereby incorporated by reference in their entireties.

TECHNICAL FIELD

Embodiments of the present invention relate to the field of mobile telecommunications, and in particular, to a base station clock apparatus, a base station system, and a method for clock synchronization.

BACKGROUND

With the development of mobile telecommunications technologies, a multimode base station, that is, a base station capable of supporting a plurality of radio access technologies at the same time, has appeared. For example, a base station that is capable of supporting the two RATs, GSM (Global System for Mobile Communications; global system for mobile communications) and UMTS (Universal Mobile Telecommunications System; universal mobile telecommunications system) at the same time is called a GU dual-mode base station.

One solution of a multimode base station is superimposing boards of different standards to form a multimode base station. Taking a GU dual-mode base station as an example for illustration, a BBU (Base Band Unit; baseband unit) includes main control boards of various standards and boards that are of various standards and provide a CPRI interface (Common Public Radio Interface, common public radio interface). The board that provides a CPRI interface may be integrated with the main control board (such as the GSM standard), or it may be integrated with a service processing board (such as the UMTS standard).

As the radio frequency module of a multimode base station supports various standards, the system clock of a multimode radio frequency module must be synchronized with the main control system clocks of the two standards. Otherwise, the CPRI interface may experience problems, such as out-of-synchronization and malfunction of the intermediate radio frequency processing part.

Therefore, in a multimode base station, the synchronization of system clocks (or timing loop) of different standards is required.

SUMMARY

Embodiments of the present invention provide a base station clock apparatus, a base station system, and a method for clock synchronization, which are capable of enabling synchronization of system clocks of different standards, In one aspect, an embodiment of the present invention provides a base station clock apparatus, including: a first-standard clock module based on a first standard, configured to generate a first frequency synchronization clock signal, a first phase synchronization signal, and a first system clock signal according to a first external clock signal, where the first system clock signal includes the first frequency synchronization clock signal and the first phase synchronization signal; a second-standard clock module based on a second standard that is different from the first standard, configured to receive the first frequency synchronization clock signal and the first phase synchronization signal from the first-standard clock module, and generate a second system clock signal, where the second system clock signal includes the first frequency synchronization clock signal and the first phase synchronization signal.

In another aspect, an embodiment of the present invention provides a base station system, including the foregoing base station clock apparatus and a radio frequency module apparatus. The radio frequency module apparatus is configured to receive a first system clock signal and a second system clock signal from the base station clock apparatus and select one from the first system clock signal and the second system clock signal as the input of a local clock frequency restoration.

In still another aspect, an embodiment of the present invention provides a method for clock synchronization in a base station clock apparatus, where the base station clock apparatus includes a first-standard clock module based on a first standard and a second-standard clock module based on a second standard that is different from the first standard, including: generating, by the first-standard clock module, a first frequency synchronization clock signal, a first phase synchronization signal, and a first system clock signal according to a first external clock signal, where the first system clock signal includes the first frequency synchronization clock signal and the first phase synchronization signal; receiving, by the second-standard clock module, the first frequency synchronization clock signal and the first phase synchronization signal from the first-standard clock module, and generating a second system clock signal, where the second system clock signal includes the first frequency synchronization clock signal and the first phase synchronization signal.

Based on the above, in the embodiments of the present invention, the clock modules of a plurality of standards may generate system clock signals of identical frequency synchronization clock signal and phase synchronization signal so that the frequencies and phases between the system clock signals generated by the clock modules of different standards are capable of synchronizing with each other. Accordingly, clock synchronization is implemented.

BRIEF DESCRIPTION OF DRAWINGS

To illustrate the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

Embodiments of the present invention can be applied to multimode scenarios formed by different standards, and are applicable to multimode base stations that are combined by all kinds of standards, such as GSM, UMTS, CDMA (Code Division Multiple Access; code division multiple access), WiMAX (Worldwide Interoperability for Microwave Access; worldwide interoperability for microwave access), and LTE (Long Term Evolution; LONG TERM EVOLUTION), including but not limited to a dual-mode base station combined by GSM and UMTS, a dual-mode base station combined by UMTS and CDMA, a base station combined by UMTS and LTE, and a triple-mode base station combined by GSM, UMTS, and LTE. To simplify the description and avoid exclusiveness, the following takes a dual-mode base station (such as the GU dual-mode base station combined by GSM and UMTS) as an example. However, it should be noted that the scope of the multimode base station in the embodiments of the present invention is not restricted in aspects of mode types and number.

Figure 1:
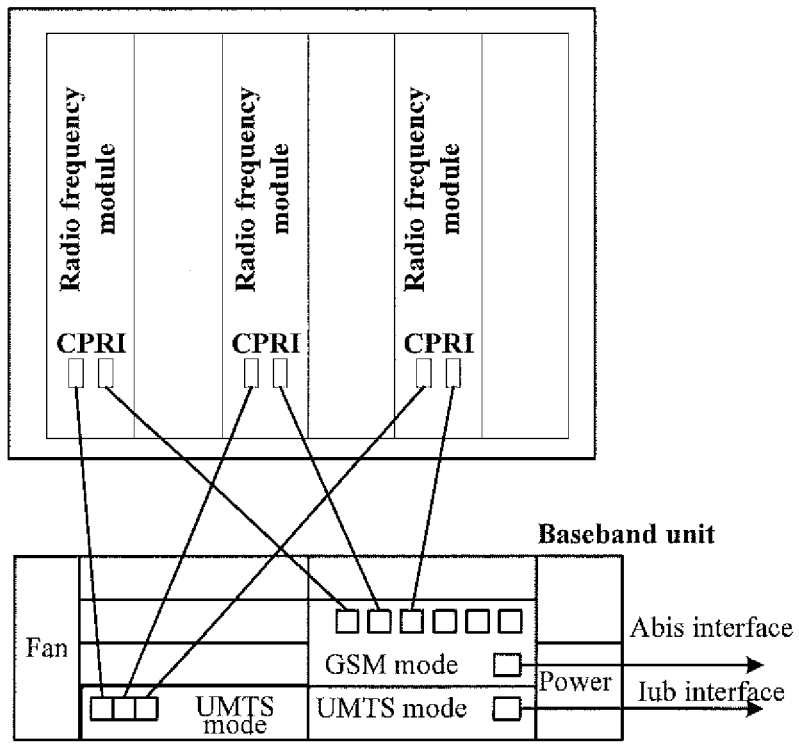
FIG. 1 is a schematic structural diagram of a dual-mode GU macro base station.
Figure 2:
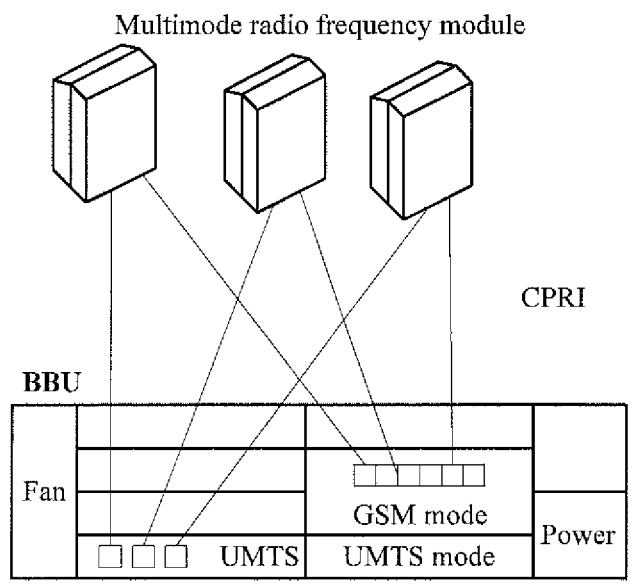
FIG. 2 is a schematic structural diagram of a dual-mode distributed GU base station.

In addition, the embodiments of the present invention are not only applicable to a multimode macro base station, but also applicable to a distributed multimode base station. FIG. 1 is a schematic structural diagram of a dual-mode GU macro base station. FIG. 2 is a schematic structural diagram of a dual-mode distributed GU base station.

The two multimode base stations shown in FIG. 1 and FIG. 2 are both configured with co-module radio frequency modules (multimode radio frequency modules) to support a plurality of standards. The radio frequency module and the BBU are connected by a CPRI link. In this case, the CPRI links of all standards are aggregated. Therefore, the system clocks of the two standards must be strictly synchronized in aspects of frequency and phase. In other words, the working clocks of the CPRI must be strictly synchronized. As the CPRI multiplexed frame is performed based on the frame number (FN; Frame Number) of frame timing, the frame timing (or the frame number) of the CPRI between different standards of the multimode base station must be strictly synchronized. Therefore, it is required in a BBU that the system clocks for radio services in different standards can be synchronized.

Figure 3:
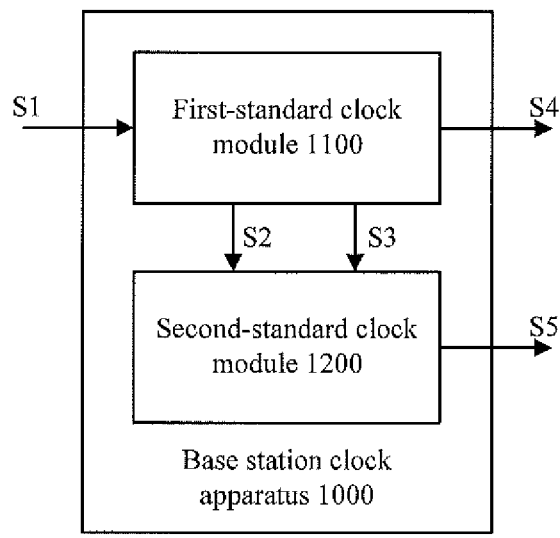
FIG. 3 is a schematic block diagram of a base station clock apparatus according to an embodiment of the present invention.

FIG. 3 is a schematic block diagram of a base station clock apparatus 1000 according to an embodiment of the present invention. The base station clock apparatus 1000 includes a first-standard clock module 1100 and a second-standard clock module 1200. The first-standard clock module 1100 is based on a first standard, and the second-standard clock module 1200 is based on a second standard that is different from the first standard.

The first-standard clock module 1100 may receive externally a first external clock signal, S1. The first external clock signal S1 may be a signal of an external clock source, such as a GPS (Global Positioning System; global positioning system) clock, an E1 clock, an IP (Internet Protocol; Internet protocol) clock, and a BITS (Building Integrated Timing Supply System; building integrated timing supply system) clock.

The first-standard clock module 1100 generates a first frequency synchronization clock signal (system clock frequency) S2, a first phase synchronization signal (frame timing signal) S3, and a first system clock signal S4 according to a first external clock signal S1, where the first system clock signal S4 includes the first frequency synchronization clock signal S2 and the first phase synchronization signal S3.

The second-standard clock module 1200 receives the first frequency synchronization clock signal S2 and first phase synchronization signal S3 from the first-standard clock module 1100, and generates a second system clock signal S5, where the second system clock signal S5 includes the first frequency synchronization clock signal S2 and the first phase synchronization signal S3.

In this way, the system clock signals S4 and S5 output by the clock modules 1100 and 1200 of the two standards contain the same frequency and phase, which achieves the effect of strict synchronization.

Figure 4:
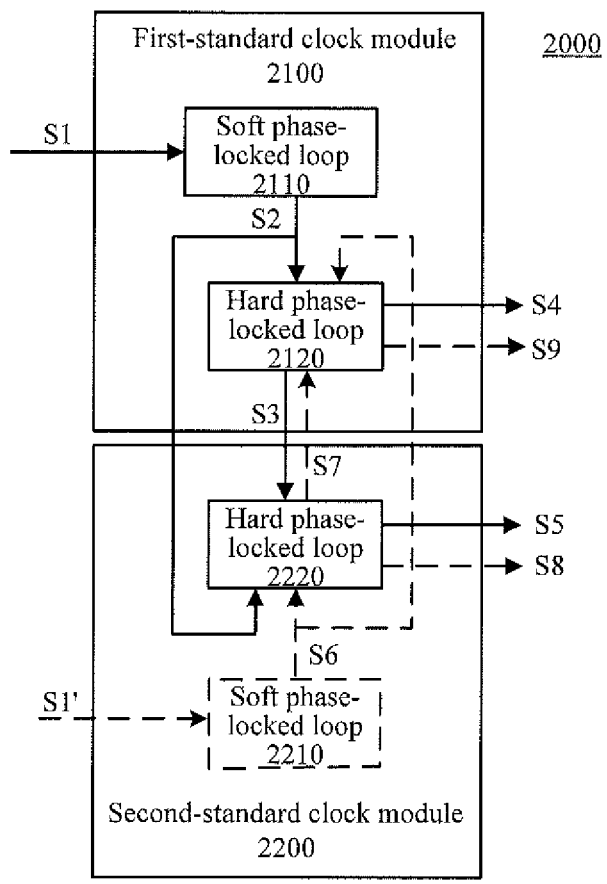
FIG. 4 is a schematic block diagram of an example of a base station clock apparatus according to an embodiment of the present invention.

According to an embodiment of the present invention, a system clock may be generated by the combination of soft and hard phase-locked loops. FIG. 4 is a schematic block diagram of a base station clock apparatus 2000 according to an embodiment of the present invention. It should be noted that the connection relationship as shown in this specification and the accompanying drawings does not suggest that the two blocks must be directly connected. Instead, they may also be indirectly connected by one or a plurality of in-between blocks or in-between circuits/apparatuses/wires. Meanwhile, the connection relationship does not mean that the two blocks must be connected in a wired manner, and it may also be connected in a wireless manner. Similarly, the signal flow between two blocks as shown in this specification and the accompanying drawings does not mean that the signal must be transmitted directly from one block to another block, yet it may also be indirectly transmitted through one or a plurality of in-between blocks. All these connection manners and signal flows fall within the scope of the embodiments of the present invention.

Similar to the base station clock apparatus 1000 in FIG. 3, a base station clock apparatus 2000 includes a first-standard clock module 2100 and a second-standard clock module 2200. The first-standard clock module 2100 is based on a first standard, and the second-standard clock module 2200 is based on a second standard that is different from the first standard.

Specifically, the first-standard clock module 2100 may include a first soft phase-locked loop 2110 and a first hard phase-locked loop 2120. As shown in FIG. 4, a first external clock signal S1 is firstly transmitted to the first soft phase-locked loop 2110. Through processing, such as frequency dividing and phase lock, according to the first external clock signal S1, the first soft phase-locked loop 2110 generates a first frequency synchronization clock signal S2 (such as a 10 MHz or 13 MHz clock signal).

The first hard phase-locked loop 2120 receives the first frequency synchronization clock signal S2 from the first soft phase-locked loop 2110 and generates a first phase synchronization signal (frame timing signal) S3. In addition, further through frequency dividing and phase lock, the first hard phase-locked loop 2120 sends a steady system clock signal S4. S4 includes both the first frequency synchronization clock signal S2 and the first phase synchronization signal S3.

The second-standard clock module 2200 includes a second hard phase-locked loop 2220. In order to achieve system clock synchronization of the multimode base station in two standards, the frequency synchronization clock signal S2 sent by the first standard may be sent through a backplane to the hard phase-locked loop 2220 of the second standard, and the phase synchronization signal (that is, the frame timing signal) S3 output by the first-standard hardware phase-locked loop 2120 is sent to the second-standard hardware phase-locked loop 2220 as a reference signal for the frequency dividing and phase lock of S2, thereby generating a steady second system clock signal S5. In this way, the system clock signal S5 also includes the first frequency synchronization clock signal S2 and the first phase synchronization signal S3. Therefore, the final system clocks S4 and 55 sent by the two standards achieve the effect of strict synchronization.

The foregoing describes the manner for locking the clock signal of the second-standard clock module 2200 according to the clock signal of the first-standard clock module 2100 (The clock signal flow shown by the real lines in FIG. 4). In this case, the system may function properly. As the second-standard hardware phase-locked loop 2220 selects the output of the first-standard soft phase-locked loop 2110, in the whole base station, only the first-standard external clock source S1 is functioning.

Similarly, the first standard may also be locked through the second standard, and the system may function properly as well. In this case, as shown by the broken lines in FIG. 4, the second-standard clock module 2200 may also include a second soft phase-locked loop 2210, which is configured to receive a second external clock signal S1'. The second external clock signal S1' may be identical with or different from the first external clock signal S1.

Similar to the operations of the first soft phase-locked loop 2110, the second soft phase-locked loop 2210 generates a second frequency synchronization clock signal S6 according to the second external clock signal S1'.

Similar to the operations of the first hard phase-locked loop 2120, the second hard phase-locked loop 2220 is further configured to receive a second frequency synchronization clock signal S6 from the second soft phase-locked loop 2210, and generate a second phase synchronization signal S7 and a third system clock signal S8. The third system clock signal S8 includes the second frequency synchronization clock signal S6 and the second phase synchronization signal S7.

Then, as shown by the signal flow in broken lines in FIG. 4, the first hard phase-locked loop 2120 is also configured to receive the second frequency synchronization clock signal S6 from the second soft phase-locked loop 2210 and receive the second phase synchronization signal S7 from the second hard phase-locked loop 2220, and generate a fourth system clock signal S9. The fourth system clock signal S9 also includes the second frequency synchronization clock signal S6 and the second phase synchronization signal S7. In this way, the third system clock signal S8 and the fourth system clock signal S9 also share identical frequency and phase, which achieves the effect of strict synchronization. It should be noted that, at this time, in the whole base station, only the second-standard external clock source S1' is functioning, and the first-standard external clock source S1 is not functioning. In other words, at the same time, the first standard is capable of locking the second standard or the second standard is capable of locking the first standard. The two standards are not capable of locking each other at the same time.

In this structure, backup may be provided for a base station clock in order to improve system reliability. For example, at first, the first standard locks the second standard. If the first-standard clock signal experiences exceptions in the running process (such as an exception of the first soft phase-locked loop 2110), a switchover may be performed so that the second standard locks the first standard instead, and the system may still continue functioning properly.

In addition, apart from public information, the frame synchronization information of different standards also contains exclusive information. Accordingly, the finally sent system clock frame synchronization information of different standards may contain the public frame synchronization information and the exclusive frame synchronization information (such as GFN frame timing exclusively owned by the GSM standard).

Figure 5:
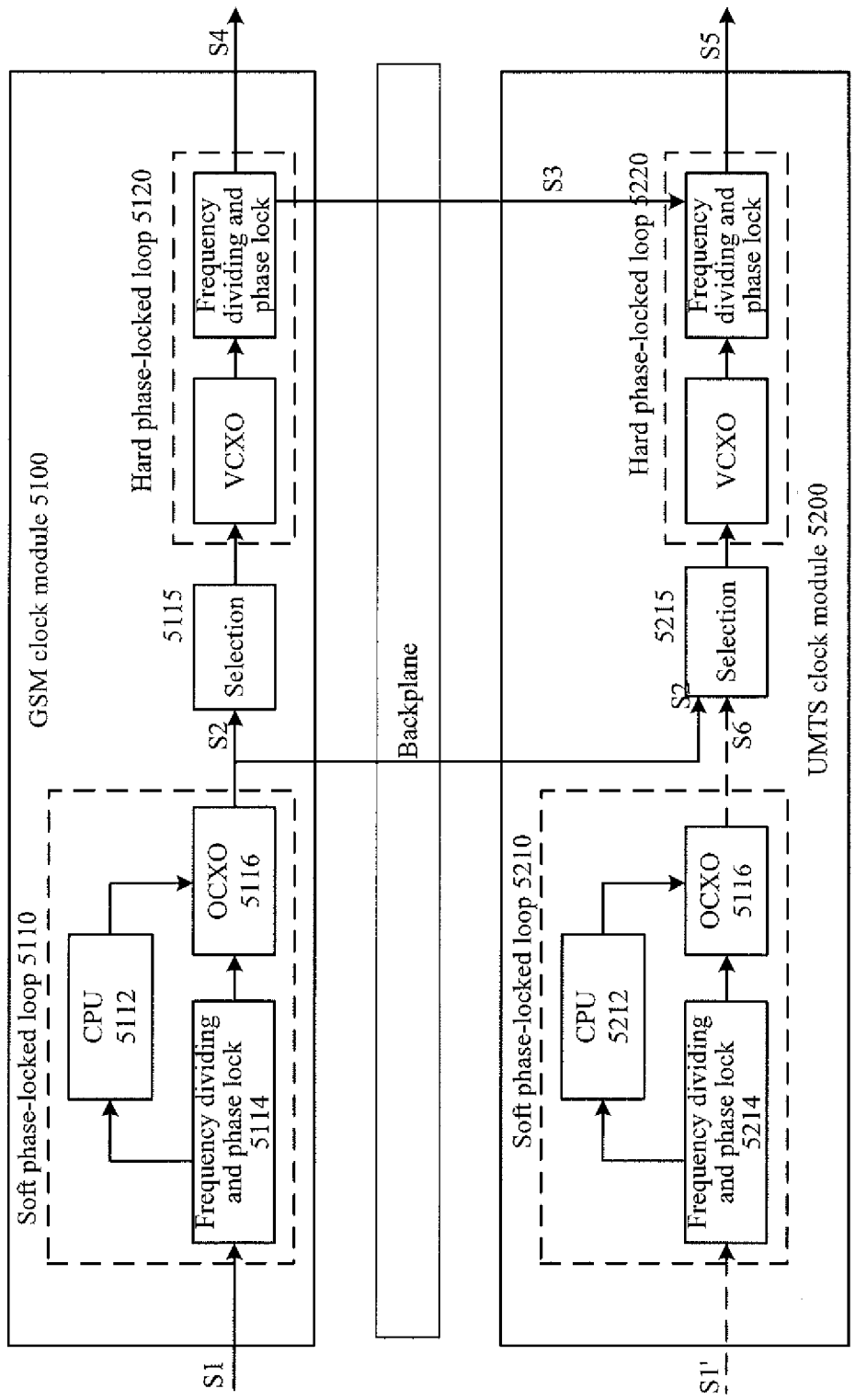
FIG. 5 is a schematic block diagram of an example of a base station clock apparatus according to an embodiment of the present invention.

The following takes the system clock synchronization solution of the GU dual-mode base station system as an example to describe how to synchronize a system clock. FIG. 5 is a schematic block diagram of an example of a base station clock apparatus 5000 in a GU dual-mode base station according to an embodiment of the present invention. FIG. 5 shows how a UMTS locks a GSM system clock.

Specifically, the base station clock apparatus 5000 includes a GSM clock module 5100 and a UMTS clock module 5200. The two clock modules may be formed by main processing and timing units of respective standards. The soft phase-locked loop 5110 of the GSM clock module 5100 is formed by a CPU (Central Processing Unit; central processing unit) 5112, a frequency dividing and phase lock module 5114, and an OCXO (Oven Controlled Crystal Oscillator; oven controlled crystal oscillator) 5116. The transmitted system clock (namely, a first frequency synchronization clock signal) S2 is 13 M. (It may also be 10 M, depending on the implemented hardware, and the theory of the embodiment of the present invention is not affected.) The 13 M clock signal S2 is sent to a hard phase-locked loop 5120 of its own board, and also sent to a hard phase-locked loop 5220 of the clock module 5200 in the UMTS standard. For example, it is sent through a backplane to the hard phase-locked loop 5220.

Similarly, the soft phase-locked loop 5210 of the UMTS clock module 5200 is formed by a CPU 5212, a frequency dividing and phase lock module 5214, and an OCXO 5216, and outputs a 13 M (or a 10 M) system clock (namely, a second frequency synchronization clock signal) S6.

A selection module 5215 may be set between the soft phase-locked loop 5210 and the hard phase-locked loop 5220 of the UMTS clock module 5200. The selection module 5215 may select to receive which clock from the frequency synchronization clock signals S2 and S6 to output it to the hard phase-locked loop 5220 as required. Certainly, if a second external clock signal S1' is not used, the selection module 5215 may be deselected, and the first frequency synchronization clock signal S2 is directly adopted.

The hard phase-locked loop 5220 of the UMTS clock module 5200 is formed by two parts, a VCXO (Voltage-controlled Crystal Oscillator; voltage-controlled crystal oscillator) 5222 and a frequency dividing and phase lock module 5224. Similarly, the hard phase-locked loop 5120 of a GSM missing module 5100 is formed by a VCXO 5122 and a frequency dividing and phase lock module 5124.

If the selection module 5215 selects the first frequency synchronization clock signal S2, the VCXO 5222 generates a hard phase lock clock signal according to the first frequency synchronization clock signal S2 and outputs it to the hard phase-locked loop 5220. If the selection module 5215 selects the second frequency synchronization clock signal S6, the VCXO 5222 generates a hard phase lock clock signal according to the second frequency synchronization clock signal S6 and outputs it to the hard phase-locked loop 5220.

As shown in FIG. 5, the system clock frame timing (namely, a first phase synchronization signal S3 sent from the hard phase-locked loop 5120 is further sent to the frequency dividing and phase lock module 5224 of the hard phase-locked loop 5220 in the UMTS clock module 5200. The frequency dividing and phase lock module 5224 of the UMTS strictly aligns its frame timing to that of the GSM with reference to the phase synchronization signal S3, and generates a system clock signal S5 that is synchronized with the system clock signal S4 of the GSM. In this way, the system clocks finally output by the GSM and the UMTS are synchronized in aspects of frequency and time (phase).

FIG. 5 mainly shows how a UMTS locks a GSM system clock. However, similar to FIG. 4, FIG. 5 may also illustrate how the GSM locks the UMTS system clock. Under such circumstances, a selection module 5115 may also be set between the soft phase-locked loop 5110 and the hard phase-locked loop 5120 of the GSM clock module 5100. This is performed to back up the clock, which may improve the system stability.

It should be noted that, the terms in this specification such as "first" and "second" do not restrict the scope of the embodiments of the present invention. As these terms are symmetrical, they are interchangeable. For example, in the implementation manner, by which the GSM locks the UMTS system clock, the frequency synchronization clock signal and the frame timing signal output by the UMTS may also be called the first frequency synchronization clock signal S2 and the first phase synchronization signal S3 respectively.

Figure 6:
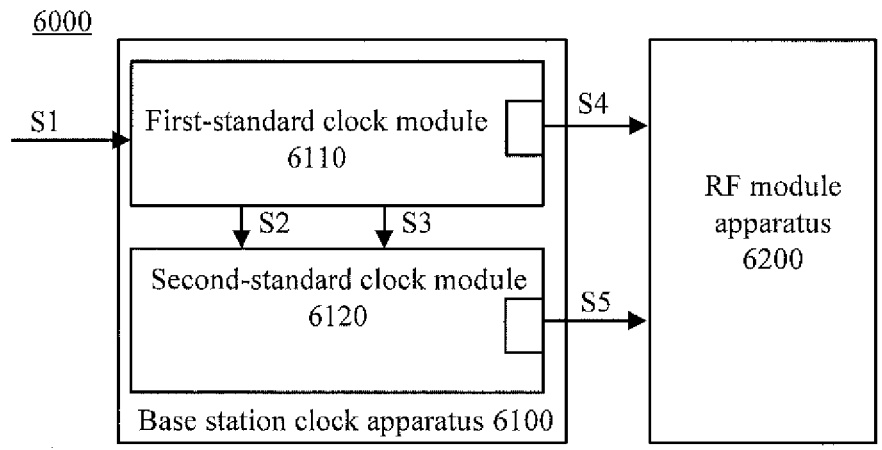
FIG. 6 is a schematic block diagram of a base station system according to an embodiment of the present invention.

The base station clock apparatuses 1000, 2000, and 5000 may be applied to the base station system. FIG. 6 is a schematic block diagram of an example of a base station system 6000 according to an embodiment of the present invention. It should be noted that, FIG. 6 mainly shows a part of the apparatus for clock synchronization. However, this does not suggest that the base station 6000 does not include other function modules. For example, the base station system 6000 may also include function modules, such as the function module regarding service signal flow.

The base station system 6000 includes a base station clock apparatus 6100 and a radio frequency module apparatus 6200. Base station clock apparatus 6100 may be the base station clock apparatus 1000, 2000, or 5000, including a first-standard clock module 6110 and a second-standard clock module 6120. FIG. 6 shows an implementation manner of how a second standard locks a first standard, namely, according to an external clock source S1 of the first-standard clock module 6110, by similar operations of the base station clock apparatus 1000, 2000, or 5000, respectively generating a first system clock signal S4 and a second system clock signal S5. Then, the first system clock signal S4 and the second system clock signal S5 contain identical frequency synchronization clock signal and phase synchronization signal. Therefore, strict synchronization is realized.

A radio frequency module apparatus 6200 is a multimode radio frequency module, which requires synchronization with the main control system clocks in at least two standards. A dual-mode base station is taken as an example for illustration. Therefore, the radio frequency module apparatus 6200 receives the first system clock signal S4 and the second system clock signal S5 and selects one system clock signal from S4 and S5 as required to acquire a restoration clock signal. In this way, both standards and the multimode radio frequency module use synchronized system clocks so that clock synchronization is realized in the base station system.

The clock signals S4 and S5 may be transmitted to the radio frequency module apparatus 6200 through an interface board (such as a CPRI board) that is integrated into the base station clock apparatus 6100 or an interface board that is independent of the base station apparatus 6100.

The selection principle of the radio frequency module apparatus 6200 may be: if the clock signals of both links are good, select any one, for example, randomly select one; if one signal is good while the other one is bad, select the good one; if both clock signals are bad, select none, and in this case, an exception alarm may be generated on the radio frequency module apparatus.

The situation where the base station system 6000 includes more standards is similar to this. In addition, the base station system 6000 may be a macro base station or a distributed base station whose structure is similar to that shown in FIG. 1 or FIG. 2.

Figure 7:
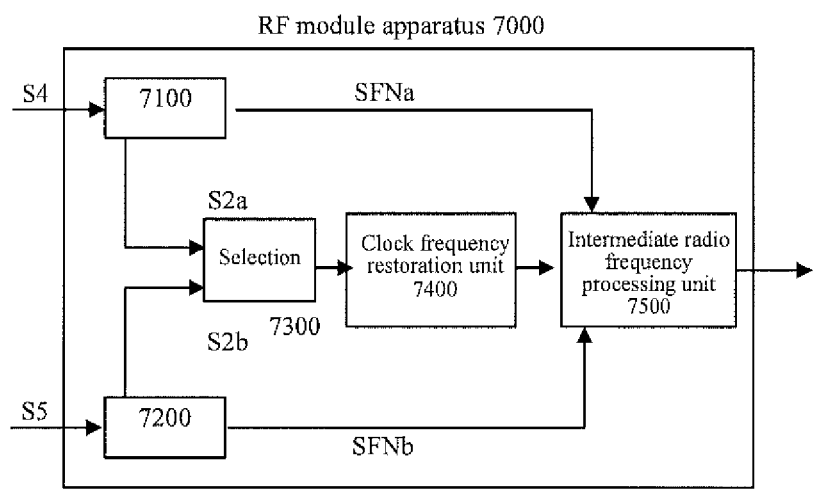
FIG. 7 is a schematic block diagram of an example of a dual-mode radio frequency module apparatus according to an embodiment of the present invention.

FIG. 7 is a schematic block diagram of an example of a dual-mode radio frequency module apparatus 7000 according to an embodiment of the present invention. As shown in FIG. 7, the radio frequency module apparatus 7000 may include a first input interface unit 7100, a second input interface unit 7200, a clock signal selection unit 7300, a clock frequency restoration unit 7400, and an intermediate radio frequency processing unit 7500.

The first input interface unit 7100 and the second input interface unit 7200 may be CPRI interfaces, which receive a first system clock signal S4 and a second system clock signal S5 respectively through a CPRI wire from a base station clock apparatus (not shown in FIG. 7).

The first input interface unit 7100 extracts a first frequency synchronization clock signal S2a from the first system clock signal S4 and outputs it to the clock signal selection unit 7300. The second input interface unit 7200 extracts a first frequency synchronization clock signal S2b from the second system clock signal S5 and outputs it to the clock signal selection unit 7300.

The clock signal selection unit 7300 selects one from the two frequency synchronization clock signals S2a and S2b as a local frequency synchronization clock signal and as the input of the local clock frequency restoration unit 7400. The clock frequency restoration unit 7400 receives a local frequency synchronization clock signal and generates a restoration clock signal.

Apart from public information, the frame synchronization information of different standards also contains exclusive information. Accordingly, the system clock frame synchronization information finally sent by the different standards may include public frame synchronization information and exclusive frame synchronization information (such as a frame timing signal).

In this case, the first input interface unit 7100 is further configured to extract a first-standard frame timing signal SFNa from the first system clock signal S4 and output it to the intermediate radio frequency processing unit 7500. The second input interface unit 7200 is further configured to extract a second-standard frame timing signal SFNb from the second system clock signal S5 and output it to the intermediate radio frequency processing unit 7500.

The intermediate radio frequency processing unit 7500 processes the restoration clock signal and the frame timing signals SFNa and SFNb by the intermediate radio frequency to acquire a radio frequency signal that may be transmitted by antennas (not shown).

Figure 8:
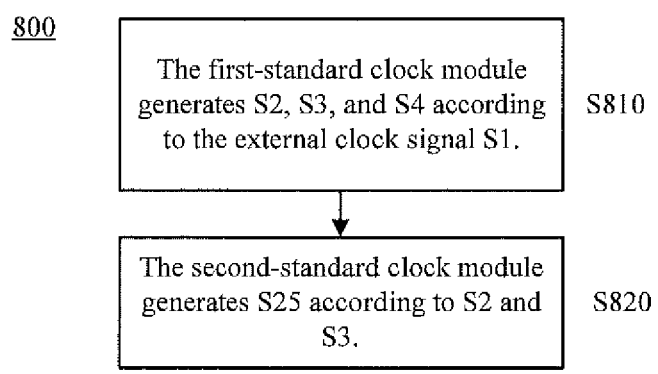
FIG. 8 is a flowchart of a method for clock synchronization in a multimode base station system according to an embodiment of the present invention.

FIG. 8 is a flowchart of a method 800 for clock synchronization in a multimode base station system according to an embodiment of the present invention. The method 800 for clock synchronization may be applied to the base station clock apparatus 1000 shown in FIG. 3. With reference to FIG. 3, the following describes the method 800 in FIG. 8.

In S810, in the method 800 for clock synchronization, the first-standard clock module 1100 generates a first frequency synchronization clock signal S2, a first phase synchronization signal S3, and a first system clock signal S4 according to a first external clock signal S1, where the first system clock signal S4 includes the first frequency synchronization clock signal S2 and the first phase synchronization signal S3.

In S820, a second-standard clock module 1200 receives the first frequency synchronization clock signal S2 and the first phase synchronization signal S3 from the first-standard clock module 1100, and generates a second system clock signal S5, where the second system clock signal S5 includes the first frequency synchronization clock signal S2 and the first phase synchronization signal S3.

The method 800 for clock synchronization may also be applied to the base station clock apparatus 2000 in FIG. 4 and the base station clock apparatus 5000 in FIG. 5, which includes the operations performed by each part of the apparatus. To avoid repetition, it is not described herein again.

In this way, by adopting the method 800 for clock synchronization according to the embodiment of the present invention, the system clock signals S4 and S5 output by the clock modules 1100 and 1200 of the two standards contain the same frequency and phase, which achieves the effect of strict synchronization.

Persons of ordinary skill in the art may appreciate that, in combination with the examples described in the embodiments disclosed in this specification, units and algorithm steps may be implemented by electronic hardware, computer software, or a combination thereof. In order to clearly describe the interchangeability between the hardware and the software, the foregoing has generally described compositions and steps of every embodiment according to functions. Whether the functions are performed by hardware or software depends on the particular applications and design restriction requirements of the technical solutions. Persons skilled in the art may use different methods to implement the described functions for each particular application, but it should not be considered that the implementation goes beyond the scope of the present invention.

The steps of a method or algorithm described in connection with the embodiments disclosed herein may be embodied directly in hardware, in a software module executed by a processor, or in a combination of the two. The software module may be located in a Random Access Memory (RAM), a computer memory, a Read Only Memory (ROM), an Electrically Programmable ROM, an Electrically Erasable Programmable ROM, a register, a hard disk, a removable disk, a CD-ROM, or any other storage media well-known in the art.

Although some embodiments of the present invention are shown and described, persons skilled in the art should understand that, various modifications could be made on these embodiments without departing from the principle and the spirit of the present invention. Such modifications should fall within the scope of the present invention.

What is claimed is:

1. A base station clock apparatus, comprising:
a non-transitory computer readable storage medium to store program(s), and
computer hardware configured to implement, including configured by the program(s) to implement:
a first-standard clock module based on a first standard, configured to generate a first frequency synchronization clock signal, a first phase synchronization signal, and a first system clock signal according to a first external clock signal, wherein the first system clock signal comprises the first frequency synchronization clock signal and the first phase synchronization signal; and
a second-standard clock module in communication with the first-standard clock module and based on a second standard that is different from the first standard, configured to receive the first frequency synchronization clock signal and the first phase synchronization signal from the first-standard clock module, and generate a second system clock signal, wherein the second system clock signal comprises the first frequency synchronization clock signal and the first phase synchronization signal,
wherein
the first-standard clock module comprises:
a first soft phase-locked loop, configured to receive the first external clock signal and generate the first frequency synchronization clock signal according to the first external clock signal; and
a first hard phase-locked loop, configured to receive the first frequency synchronization clock signal from the first soft phase-locked loop and generate the first phase synchronization signal and the first system clock signal, and
the second-standard clock module comprises:
a second hard phase-locked loop, configured to receive the first frequency synchronization clock signal from the first soft phase-locked loop and the first phase synchronization signal from the first hard phase-locked loop, and generate the second system clock signal.

2. The base station clock apparatus according to claim 1, wherein the second-standard clock module further comprises:
a second soft phase-locked loop, configured to receive a second external clock signal and generate a second frequency synchronization clock signal according to the second external clock signal, and
the second hard phase-locked loop is further configured to receive the second frequency synchronization clock signal from the second soft phase-locked loop and generate a second phase synchronization signal and a third system clock signal, wherein the third system clock signal comprises the second frequency synchronization clock signal and the second phase synchronization signal.

3. The base station clock apparatus according to claim 2, wherein the first hard phase-locked loop is further configured to receive the second frequency synchronization clock signal from the second soft phase-locked loop and the second phase synchronization signal from the second hard phase-locked loop, and generate a fourth system clock signal, wherein the fourth system clock signal comprises the second frequency synchronization clock signal and the second phase synchronization signal.

4. The base station clock apparatus according to claim 3, wherein the first-standard clock module further comprises:
a selection module, configured to receive the first frequency synchronization clock signal from the first soft phase-locked loop and receive the second frequency synchronization clock signal from the second soft phase-locked loop, and select one from the first frequency synchronization clock signal and the second frequency synchronization clock signal to output it to the first hard phase-locked loop.

5. The base station clock apparatus according to claim 2, wherein the second-standard clock module further comprises:
the selection module, configured to receive the first frequency synchronization clock signal from the first soft phase-locked loop and receive the second frequency synchronization clock signal from the second soft phase-locked loop, and select one from the first frequency synchronization clock signal and the second frequency synchronization clock signal to output it to the second hard phase-locked loop.

6. The base station clock apparatus according to claim 1, wherein the second hard phase-locked loop comprises:
a voltage-controlled crystal oscillator, configured to receive the first frequency synchronization clock signal and generate a hard phase lock clock signal; and
a frequency dividing and phase lock module, configured to receive the hard phase lock clock signal from the voltage-controlled crystal oscillator and receive the first phase synchronization signal from the first hard phase-locked loop, and generate the second system clock signal.

7. A base station system, comprising:
a base station clock apparatus, and
a radio frequency module apparatus, configured to receive a first system clock signal and a second system clock signal from the base station clock apparatus, and select one from the first system clock signal and the second system clock signal to acquire a restoration clock signal,
wherein the base station clock apparatus comprises:
a first-standard clock module based on a first standard, configured to generate a first frequency synchronization clock signal, a first phase synchronization signal, and a first system clock signal according to a first external clock signal, wherein the first system clock signal comprises the first frequency synchronization clock signal and the first phase synchronization signal; and
a second-standard clock module based on a second standard that is different from the first standard, configured to receive the first frequency synchronization clock signal and the first phase synchronization signal from the first-standard clock module, and generate a second system clock signal, wherein the second system clock signal comprises the first frequency synchronization clock signal and the first phase synchronization signal, wherein
the first-standard clock module comprises:
a first soft phase-locked loop, configured to receive the first external clock signal and generate the first frequency synchronization clock signal according to the first external clock signal; and
a first hard phase-locked loop, configured to receive the first frequency synchronization clock signal from the first soft phase-locked loop and generate the first phase synchronization signal and the first system clock signal, and
the second-standard clock module comprises:
a second hard phase-locked loop, configured to receive the first frequency synchronization clock signal from the first soft phase-locked loop and the first phase synchronization signal from the first hard phase-locked loop, and generate the second system clock signal.

8. The base station system according to claim 7, wherein the base station system is a macro base station or a distributed base station.

9. A base station system comprising:
a base station clock apparatus, and
a radio frequency module apparatus, configured to receive a first system clock signal and a second system clock signal from the base station clock apparatus, and select one from the first system clock signal and the second system clock signal to acquire a restoration clock signal,
wherein the base station clock apparatus comprises:
a first-standard clock module based on a first standard, configured to generate a first frequency synchronization clock signal, a first phase synchronization signal, and a first system clock signal according to a first external clock signal, wherein the first system clock signal comprises the first frequency synchronization clock signal and the first phase synchronization signal; and
a second-standard clock module based on a second standard that is different from the first standard, configured to receive the first frequency synchronization clock signal and the first phase synchronization signal from the first-standard clock module, and generate a second system clock signal, wherein the second system clock signal comprises the first frequency synchronization clock signal and the first phase synchronization signal, wherein the radio frequency module apparatus comprises:
a first input interface unit, configured to receive the first system clock signal and extract a first frequency synchronization clock signal from the first system clock signal;
a second input interface unit, configured to receive the second system clock signal and extract a first frequency synchronization clock signal from the second system clock signal;
a clock signal selection unit, configured to select one from the first frequency synchronization clock signal in the first system clock signal and the first frequency synchronization clock signal in the second system clock signal as a local frequency synchronization clock signal; and
a clock frequency restoration unit, configured to receive the local frequency synchronization clock signal and generate the restoration clock signal.

10. The base station system according to claim 9, wherein the first system clock signal further comprises a first-standard frame timing signal, and the second system clock signal further comprises a second-standard frame timing signal,
the first input interface unit is further configured to extract the first-standard frame timing signal from the first system clock signal;
the second input interface unit is further configured to extract the second-standard frame timing signal from the second system clock signal; and
the radio frequency module apparatus further comprises:
an intermediate radio frequency processing unit, configured to receive the restoration clock signal, receive the first-standard frame timing signal and the second-standard frame timing signal, and process the restoration clock signal, the first-standard frame timing signal, and the second-standard frame timing signal by the intermediate radio frequency.

11. A method for clock synchronization in a base station clock apparatus, wherein the base station clock apparatus comprises a first-standard clock module based on a first standard and a second-standard clock module based on a second standard that is different from the first standard, the method comprising:
generating, by the first-standard clock module of the base station clock apparatus, a first frequency synchronization clock signal, a first phase synchronization signal, and a first system clock signal according to a first external clock signal, wherein the first system clock signal comprises the first frequency synchronization clock signal and the first phase synchronization signal; and
receiving, by the second-standard clock module of the base station apparatus, the first frequency synchronization clock signal and the first phase synchronization signal from the first-standard clock module, and generating by the second-standard clock module of the base station clock apparatus a second system clock signal, wherein the second system clock signal comprises the first frequency synchronization clock signal and the first phase synchronization signal; and wherein the first-standard clock module comprises a first soft phase-locked loop and a first hard phase-locked loop, and the second-standard clock module comprises a second hard phase-locked loop, the generating a first frequency synchronization clock signal, a first phase synchronization signal, and a first system clock signal, comprises:

receiving, by the first soft phase-locked loop, the first external clock signal, and generating the first frequency synchronization clock signal according to the first external clock signal; and receiving, by the first hard phase-locked loop, the first frequency synchronization clock signal from the first soft phase-locked loop, and generating the first phase synchronization signal and the first system clock signal, and the generating a second system clock signal comprises:

receiving, by the second hard phase-locked loop, the first frequency synchronization clock signal from the first soft phase-locked loop and the first phase synchronization signal from the first hard phase-locked loop, and generating the second system clock signal.

12. The method according to claim 11, wherein the second-standard clock module further comprises a second soft phase-locked loop, the method further comprising:

receiving, by the second soft phase-locked loop, a second external clock signal, and generating a second frequency synchronization clock signal according to the second external clock signal, and receiving, by the second hard phase-locked loop, the second frequency synchronization clock signal from the second soft phase-locked loop, and generating a second phase synchronization signal and a third system clock signal, wherein the third system clock signal comprises the second frequency synchronization clock signal and the second phase synchronization signal.

13. The method according to claim 12, further comprising:

receiving, by the first hard phase-locked loop, the second frequency synchronization clock signal from the second soft phase-locked loop and the second phase synchronization signal from the second hard phase-locked loop, and generating a fourth system clock signal, wherein the fourth system clock signal comprises the second frequency synchronization clock signal and the second phase synchronization signal.

* * * * *